United States Patent [19]

Edwards

[11] 4,342,101

[45] Jul. 27, 1982

[54] NONVOLATILE SEMICONDUCTOR MEMORY CIRCUITS

[75] Inventor: Colin W. Edwards, Chalfont St. Peters, England

[73] Assignee: Hughes Microelectronics Limited, Glenrothes, Scotland

[21] Appl. No.: 202,519

[22] Filed: Oct. 31, 1980

[30] Foreign Application Priority Data

Nov. 12, 1979 [GB] United Kingdom ............... 7939044

[51] Int. Cl.³ .................................... G11C 13/00
[52] U.S. Cl. .................................. 365/154; 365/189
[58] Field of Search ............. 365/154, 155, 156, 189, 365/230

[56] References Cited

U.S. PATENT DOCUMENTS 4,004,284 1/1977 Haren ........................... 365/154

Primary Examiner—Terrell W. Fears
Attorney, Agent, or Firm—John Holtrichter, Jr.; W. H. MacAllister

[57] ABSTRACT

An NMOS non-volatile latch having N-channel drivers $Q_1$ and $Q_2$ and variable threshold N-channel FATMOS transistors $Q_3$ and $Q_4$ as depletion loads. The control gate of each FATMOS transistor is coupled to its own node ($X_1$ or $X_2$) so as to operate in depletion, whereas to obtain the correct voltage stresses the tunnels of the FATMOS floating gates are cross-coupled to the opposite latch nodes.

5 Claims, 1 Drawing Figure

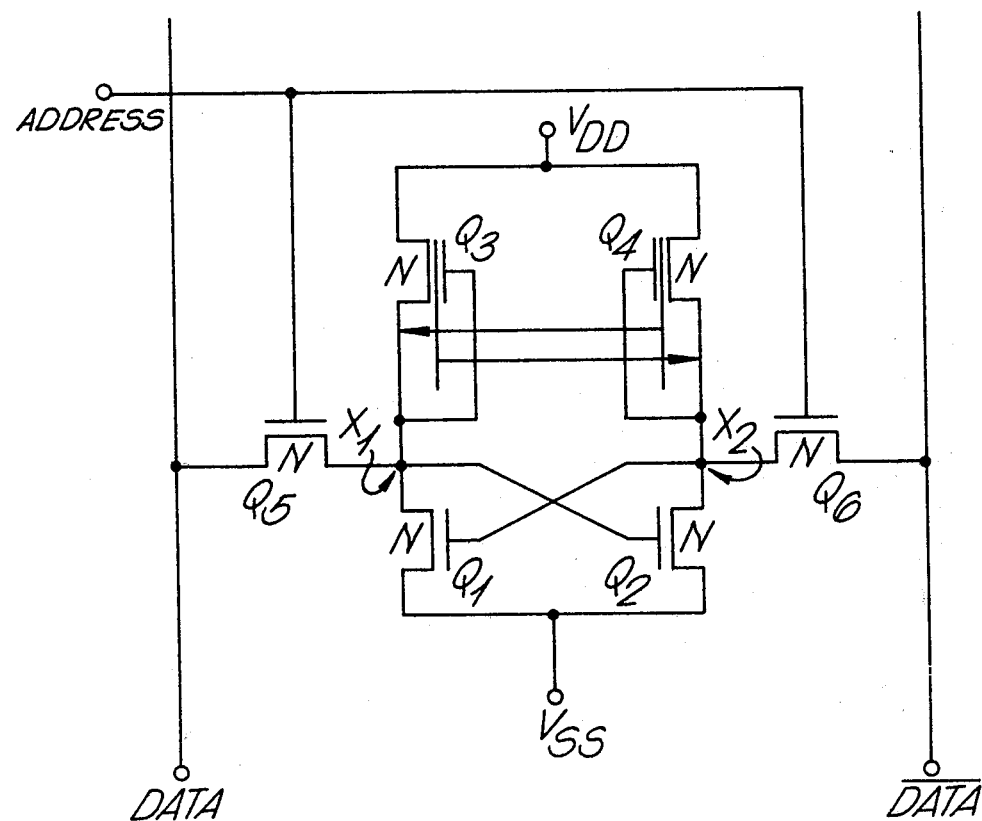

NONVOLATILE SEMICONDUCTOR MEMORY CIRCUITS

FIELD OF THE INVENTION

This invention relates to nonvolatile memory circuits based on a latch configuration, the latch containing NMOS transistors.

BACKGROUND OF THE INVENTION

Semiconductor memories can be classified as volatile (where stored information is lost upon power removal) and non-volatile (where stored information is maintained after power removal, and which can be accurately retrieved upon subsequent power-up).

Probably the most common type of semiconductor memory is based upon the well-known latch, or flip-flop, configuration having a pair of cross-coupled inverter transistors (the driver transistors of the latch) together with accompanying loads.

It is known to make MOS latch circuits with non-volatile characteristics: one such type of circuit is based upon the use of FATMOS transistors. FATMOS non-volatile latch circuits are described and claimed in U.S. Pat. No. 4,132,904 and U.K. Specification No. 2,000,407.

The FATMOS is basically a control gate plus floating gate MOS transistor with a portion of the floating gate lying close to the semiconductor substrate. When the source and drain connections are connected to an appropriate potential (one positive relative to the other) and a suitable potential of a first magnitude applied to the control gate, the transistor conducts. Upon removal of the control gate potential, conduction ceases. If a potential of a second and higher magnitude is applied to the control gate with the drain at zero voltage, the transistor again conducts, but in addition electric charges tunnel between the floating gate and the transistor substrate through the portion of the floating gate closest to the substrate. This charge remains on the floating gate even when the control gate potential is removed and increases the switching threshold of the device. This charge on the floating gate enables the transistor to be employed in a non-volatile memory, as described in U.K. Specification No. 2,000,407. The switching threshold of the FATMOS is returned to its original level by applying between the control gate and drain a potential of approximately the second and higher potential, but of opposite sign.

In a typical example of an N-channel enhancement-type FATMOS, the area of the floating gate closest to the substrate overlies the drain of the transistor, although this is not essential and the area closest to the substrate can be to elsewhere on the transistor. In normal, non-volatile operation, a voltage of typically +5 to +7 volts is applied to the control gate. To operate the device as a non-volatile transistor, a voltage of typically +8 to +15 volts is applied to the control gate.

It is also known to construct latch circuits from the different known types of MOS transistors notably PMOS, CMOS and NMOS. In terms of the development of MOS technology PMOS latches were initially popular since their production is the most straightforward. CMOS latches (with complementary P-channel and N-channel transistors) have also become popular mainly because of their low current consumption. NMOS latches have proved more difficult to produce on a commercial scale until relatively recently, although it has been recognised that they would have substantial advantages over other types, especially in their speed of operation—which is often of paramount consideration in memory circuits.

The above-identified U.S. and U.K. patent specifications do disclose NMOS latches with non-volatility characteristics provided by the use of FATMOS transistors. In this regard reference is directed to FIGS. 8 to 10 of said patent specifications. It is also stated in the said patent specifications that when purely N-channel or P-channel technology is employed in the latches, the variable threshold transistors (i.e. the FATMOS's) will always be the drivers. In practice, it has been found that purely NMOS latches with FATMOS driver transistors must be provided with additional NMOS transistors in series and possibly also in parallel. The reason for this resides in the fact that FATMOS transistors have a wide range of threshold voltages and cannot sometimes accurately maintain the correct logic state of the latch. During normal read operations the phenomenon of "knockover" can occur wherein, rather than the latch dictating its logic state out to the data line(s), the opposite occurs. In such a case, the data line(s) can dictate their electrical states to the latch so that the latch may change state unpredictably. This phenomenon (essentially a capacitive effect) is alleviated by inserting normal NMOS transistors in parallel with each of the FATMOS drivers. One of the disadvantages of employing such shunt transistors is that it increased the number of transistors in the latch by 50%: the area taken up by such a latch in an integrated array is hence greater than desired.

SUMMARY OF THE INVENTION

The present invention relates to an improved NMOS non-volatile latch employing a reduced number of transistors than described above, but which is not vulnerable to the "knockover" phenomenon described.

According to the present invention there is provided a non-volatile bistable semiconductor latch having a pair of cross-coupled branches connectable across a common supply voltage, each branch including an NMOS transistor driver and an NMOS load transistor connected in series at a respective node, at least one of said load transistors having a threshold voltage which may be varied by increasing the potential of a control gate of said transistor above a predetermined level relative to the potential on one of its other electrodes, whereby volatile information held by the latch is rendered non-volatile by raising said control gate potential above said predetermined level.

BRIEF DESCRIPTION OF THE DRAWING

Preferred features of the invention will now be described with reference to the accompanying drawing, given by way of example, wherein the single FIGURE is an electrical circuit diagram of a preferred embodiment of the invention.

DESCRIPTION OF THE PREFERRED EMBODIMENT

Referring to the single drawing, there is shown a purely NMOS latch having NMOS driver transistors $Q_1$ and $Q_2$ and FATMOS N-channel depletion loads $Q_3$ and $Q_4$. Each control gate of drivers $Q_1$ and $Q_2$ is cross-coupled in the usual manner to the node $X_1$ and $X_2$ of the respective other branch of the latch. A pair of read-write N-channel control transistors $Q_5$ and $Q_6$ connect the nodes to DATA and $\overline{\text{DATA}}$ lines and are switched, for reading or writing, from an $\overline{\text{ADDRESS}}$ line. The control gate of transistor $Q_3$ is connected to its source terminal (i.e. to node $X_1$) so as to function in depletion, and similarly the control gate of $Q_4$ is coupled to node $X_2$. In order to obtain the correct voltage stresses across the tunnels of the floating gates of $Q_3$ and $Q_4$, these tunnels are cross-coupled to opposing nodes: thus the tunnel of $Q_3$ leads to node $X_2$ and that for $Q_4$ to $X_1$.

The latch functions as in the same way as known NMOS latches during normal, volatile reading and writing. Storage of volatile information in the latch is accomplished by raising the control gate voltages of the FATMOS transistors so as to cause tunnelling of charges onto the floating gates. This results in a change in the threshold voltages for the loads $Q_3$ and $Q_4$. When power is removed and subsequently restored, the mismatch in the load thresholds will dictate the state into which the latch settles and, indeed, as with the FATMOS memory circuits described in U.S. Pat. No. 4,132,904 and U.K. Patent Specification No. 2,000,407, the inverse of the data stored in the latch at non-volatile writing is obtained with such a non-volatile read.

The FATMOS loads as described must always supply sufficient current to enable the driver transistors $Q_1$ and $Q_2$ to maintain the imbalance between the nodes $X_1$ and $X_2$. Thus, $Q_3$ and $Q_4$ should not be allowed to operate in the enhancement mode or, should a shift into enhancement occur, they should provide sufficient leakage current to maintain the drivers in correct operation.

A latch as described is no more vulnerable to "knockover" than a normal NMOS latch during normal volatile read, and the write conditions differ only slightly from those of a normal NMOS volatile latch. N-channel depletion loads such as illustrated in FIGS. 8 and 9 of said patent specifications have relatively large gate areas and the replacement of these transistors by FATMOS devices enables cell area to be reduced.

Although the illustrated latch employs two FATMOS depletion loads, it is possible to operate it with only one such load transistor. Thus, for example, either $Q_3$ or $Q_4$ could be replaced by a non-variable threshold N-channel transistor operating as a depletion load. It is also possible to replace either or both of the driver transistors $Q_1$ and $Q_2$ with N-channel FATMOS devices.

I claim:

1. A non-volatile bistable semiconductor latch having a pair of cross-coupled braches connectable across a common supply voltage, each branch including an NMOS transistor driver and an NMOS depletion load transistor connected in series at a respective node, at least one of said load transistors having a threshold voltage which may be varied by increasing the potential of a control gate of said transistor above a predetermined level relative to the potential on one of its other electrodes, whereby voltatile information held by the latch is rendered non-volatile by raising said control gate potential above said predetermined level.

2. A latch according to claim 1 wherein the control gate of each load transistor is connected to the node in its own respective branch of the latch.

3. A latch according to claim 1 wherein the or each load transistor of variable threshold has a floating gate with an area thereof closely adjacent the node in the opposite branch of the latch whereby charges can tunnel between said area and said closely adjacent node.

4. A latch according to claim 1 wherein each branch contains a said variable threshold transistor as its depletion load transistor.

5. A latch according to claim 1 wherein the or each node is connected to a line enabling data to the written into or read out of said latch, each said connection being controlled by an NMOS transistor.

* * * * *